US008210880B2

(12) United States Patent
Lee et al.

(10) Patent No.: US 8,210,880 B2
(45) Date of Patent: Jul. 3, 2012

(54) ELECTRICAL CONNECTOR ASSEMBLY AND ADAPTER MODULE

(75) Inventors: Kuo-Chi Lee, Taipei County (TW); Chin-Huang Lin, Taipei County (TW)

(73) Assignee: Concraft Holding Co., Ltd., Grand Cayman (KY)

( * ) Notice: Subject to any disclaimer, the term of this patent is extended or adjusted under 35 U.S.C. 154(b) by 233 days.

(21) Appl. No.: 12/650,946

(22) Filed: Dec. 31, 2009

(65) Prior Publication Data

US 2011/0014817 A1 Jan. 20, 2011

(30) Foreign Application Priority Data

Jul. 14, 2009 (TW) .............................. 98212789 U

(51) Int. Cl.
*H01R 25/00* (2006.01)
(52) U.S. Cl. ...................................... 439/639
(58) Field of Classification Search .................. 439/639, 439/676, 620.01, 632
See application file for complete search history.

(56) References Cited

U.S. PATENT DOCUMENTS

| | | | |
|---|---|---|---|
| 6,746,279 B1 * | 6/2004 | Lopez | 439/620.01 |
| 6,758,697 B1 * | 7/2004 | Wu | 439/638 |
| 6,945,822 B2 * | 9/2005 | Flemming et al. | 439/638 |
| 7,281,957 B2 * | 10/2007 | Caveney | 439/676 |
| 7,748,999 B1 * | 7/2010 | Sun et al. | 439/79 |
| 7,914,334 B2 * | 3/2011 | Foratier | 439/638 |

* cited by examiner

*Primary Examiner* — Jean F Duverne
(74) *Attorney, Agent, or Firm* — Rosenberg, Klein & Lee

(57) ABSTRACT

An electrical connector assembly includes a first connector having a plurality of first terminals; a main element for coupling to the first connector, and formed with a terminal recess for reception of the first terminals therein; and an adapter element for coupling to the main element, and including a plurality of adapter terminals. Each adapter terminal has a connecting section that is received in the terminal recess and that is electrically connected to a respective one of the first terminals.

34 Claims, 6 Drawing Sheets

ELECTRICAL CONNECTOR ASSEMBLY AND ADAPTER MODULE

This application claims the benefits of the Taiwan Patent Application Serial NO. 098212789, filed on Jul. 14, 2009, the subject matter of which is incorporated herein by reference.

BACKGROUND OF THE INVENTION

1. Field of the Invention

The present invention relates to an electrical connector assembly, more particularly to an electrical connector assembly including an adapter module via which a plurality of electrical connectors can be coupled together.

2. Description of the Prior Art

Several electrical connectors of different dimensions and specifications are available in the market. Some newly produced electronic apparatuses require the most advanced electrical connector for market competition. At the same time, the conventional electrical connectors still in use must satisfy the general users of the electronic apparatuses.

For instance, it usually requires more than five electrical connectors for connecting the peripheral devices to the display screen and the CPU of a computer set. Four to five USB (Universal Serial Bus) devices, the most common one, may be implemented in a computer set so that the electrical connectors of different types are generally stacked one above the other when in use.

Since new mother boards are developed quickly day by day, the electrical connectors for application with the new mother boards differed from one another. Therefore, an electrical connector assembly of a specific type cannot get along with the newly produced mother board. As a result, the manufacturers must design a new mold for developing a new electrical connector, thereby increasing the undesired production cost.

Since the transmission speed of the electrical connectors becomes faster as days gone by, the terminals of an electrical connector for insertion into the CPU must be spaced apart or staggered to one another at predetermined gap so as to prevent electromagnetic interference among the terminals. The manufacturers must produce the new electrical connector having terminals to conform to the soldering points on the new mother board, thereby adversely incurring undesired expense. It is urgently needed to solve the above-stated problem.

SUMMARY OF THE INVENTION

Therefore, the object of the present invention is to provide an electrical connector assembly including an adapter module via which several pieces of independently located electrical connectors can be coupled together so that the manufacturers only need to alter the specification of the adapter module for coupling several pieces of independently located electrical connectors.

The electrical connector assembly according to the present invention includes a first connector and an adapter module. The first connector has a plurality of first terminals. The adapter module is used for coupling electrically to the first connector, and is formed with a first row of retention holes and a second row of retention holes spaced apart respectively from the first retention holes in parallel manner.

When the first connector is coupled electrically to the adapter module, distal ends of the first terminals extend respectively into the first retention holes and the second retention holes in the adapter module.

In the present invention, since several independently located electrical connectors can be coupled together via the adapter module, the manufacturers in future only need to alter the structure of the adapter module in order to produce electrical connector assembly of different specifications, thereby tremendously saving a large amount of expense for opening a new mold. In addition, the adapter module of the present invention includes an adapter element capable of altering layout of the terminals of the original connector in such a manner to conform to the printed circuit board having differently located soldering contacts therein.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENTS

The feature of the present invention resides in that after coupling a first connector to an adapter module, distal ends of the terminals of the first connector are disposed parallel to one another. Afterward, a second connector is coupled to the adapter module.

Figure 1:
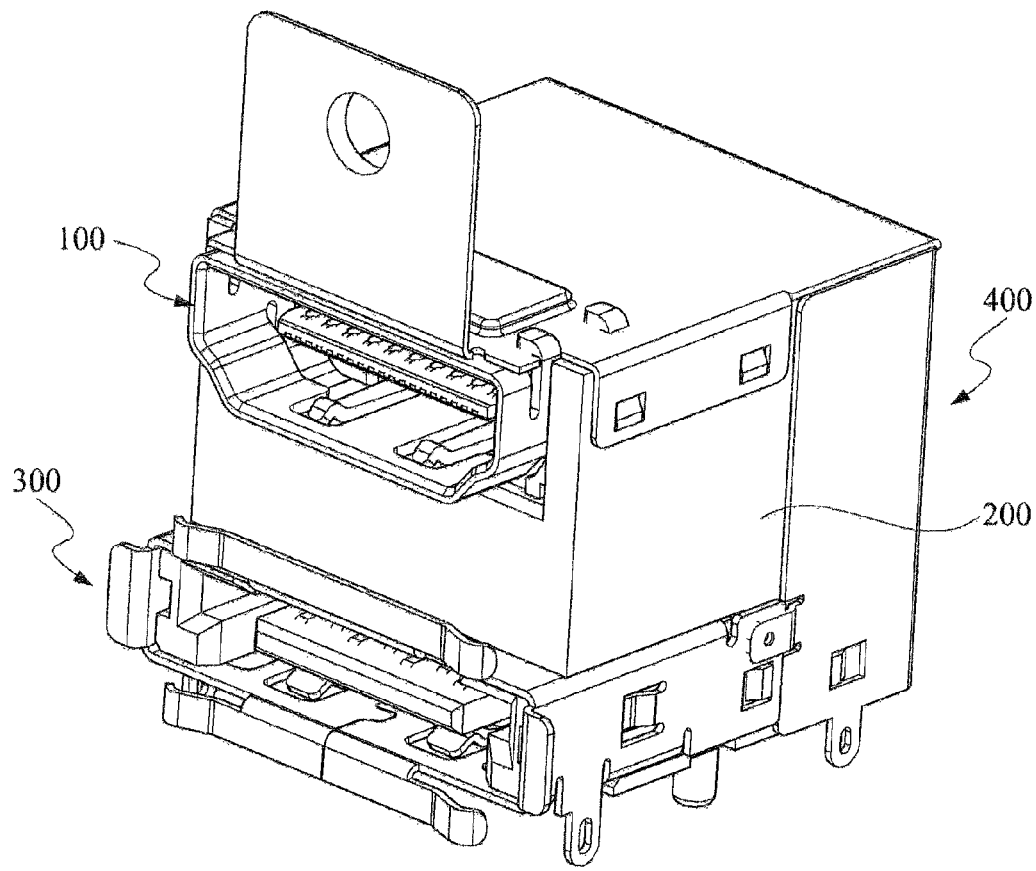
FIGS. 1 and 1A respectively show perspective view of an electrical connector assembly of the present invention.
Figure 1A:
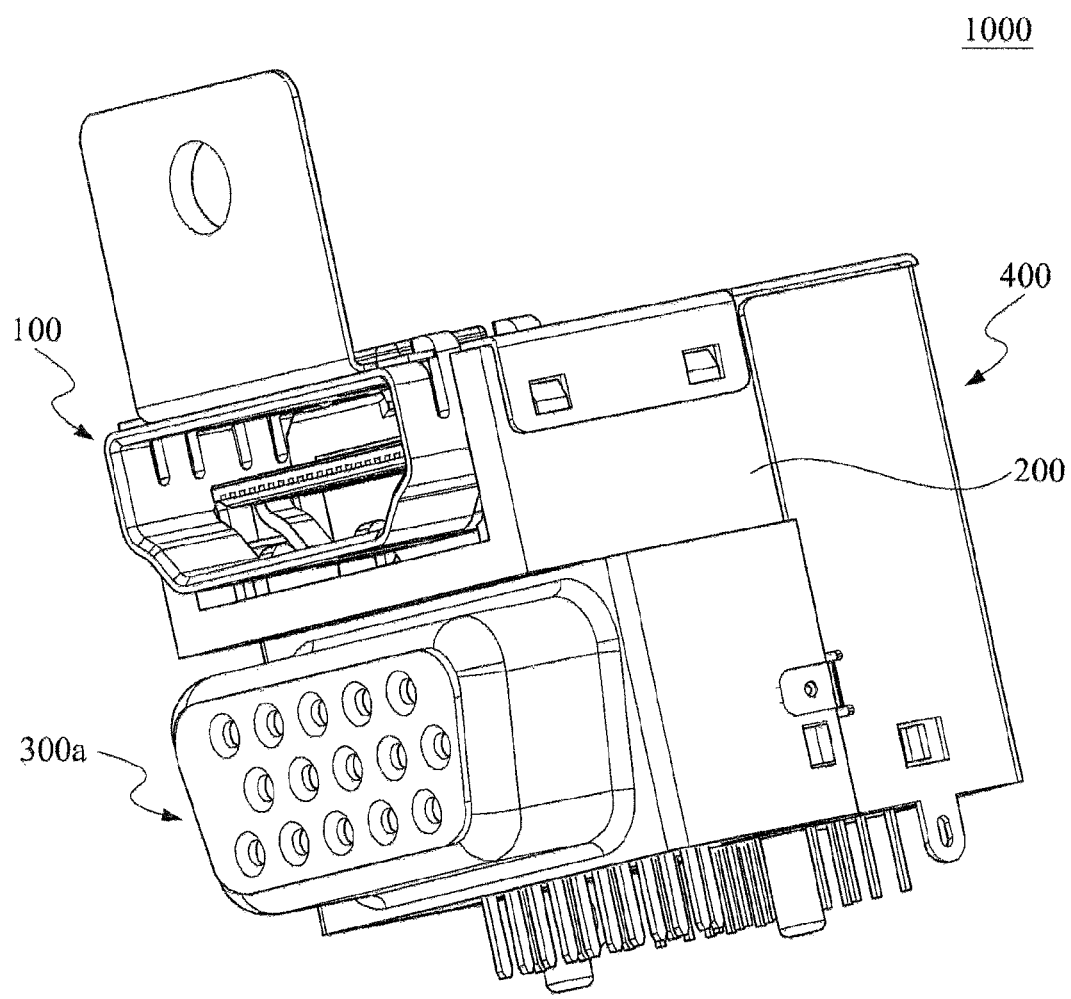

FIGS. 1 and 1A respectively show perspective view of an electrical connector assembly 1000 of the present invention. The electrical connector assembly 1000 accordingly includes a first connector 100, an adapter module 200, a second connector 300 and a metal casing 400.

The first and second connectors 100, 300 are to be coupled electrically to the adapter module 200. The metal casing 400 is provided for enclosing the first and second connectors 100, 300.

By utilizing simple variation in the adapter module 200, two pieces of independently located first and second connectors 100, 300 can be coupled electrically to the adapter module 200 so as to result in different electrical connector assembly. Note that the electrical connector assembly of FIG. 1 is different from that shown in FIG. 1A in structure.

Figure 2:
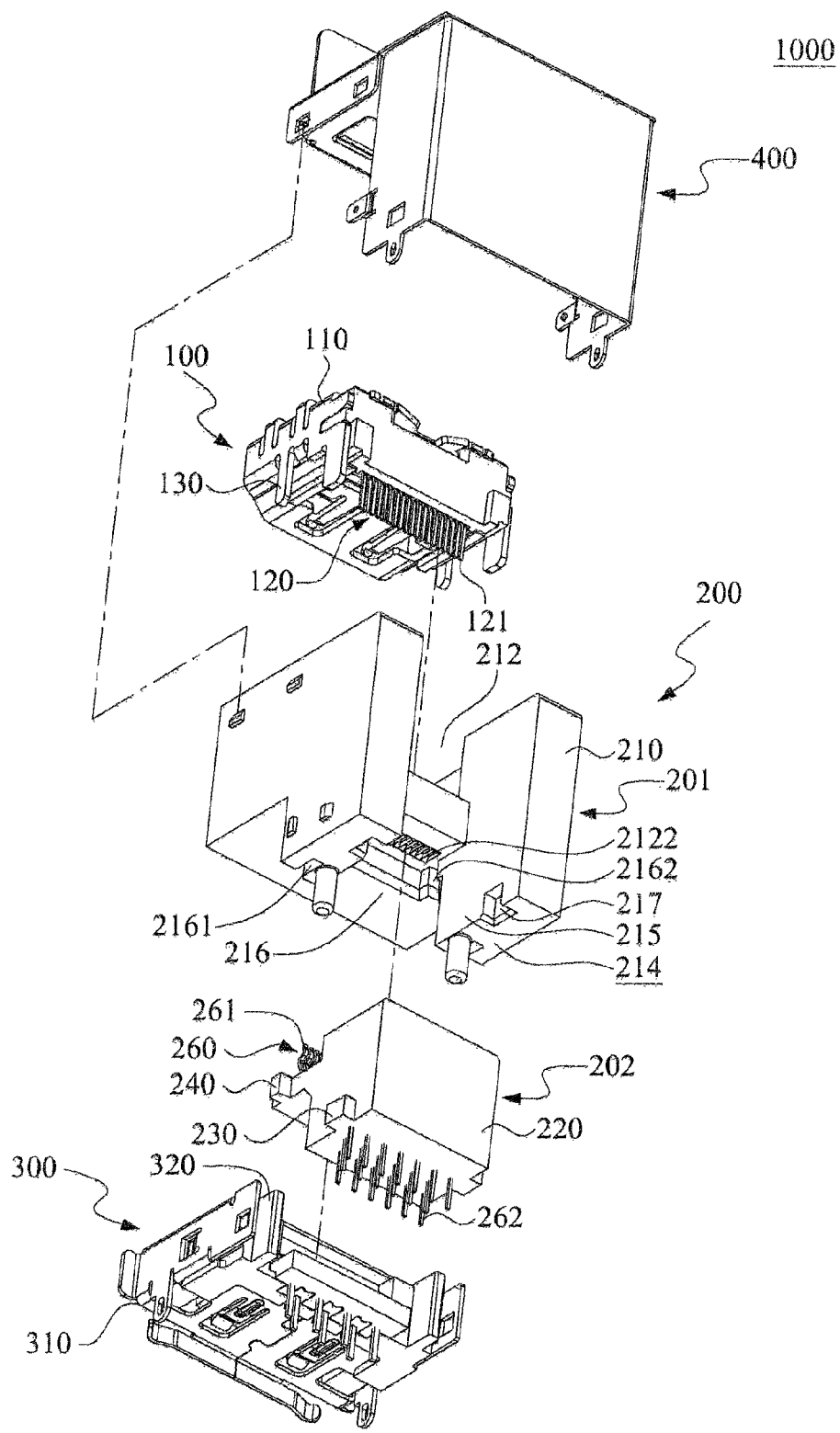
FIGS. 2 and 2A respectively show exploded view of the first embodiment of the electrical connector assembly of the present invention.
Figure 2A:
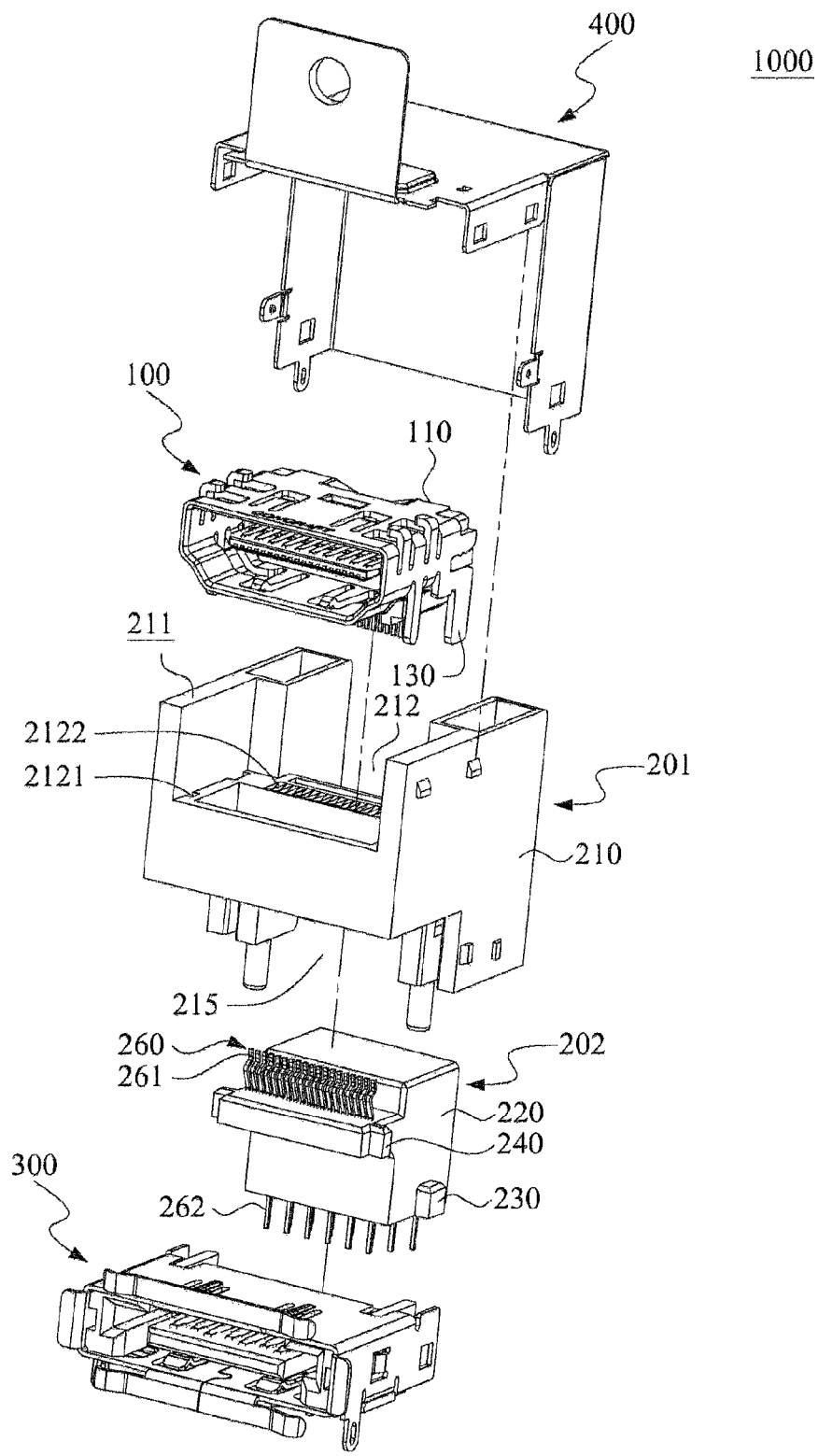

FIGS. 2 and 2A respectively show exploded view of the first embodiment of the electrical connector assembly 1000 of the present invention. In this embodiment, the first connector 100 can be DVI, D-SUB, HDMI, USB, E-SATA, RJ45 type; the restriction should not be limited only to these types. The first connector 100 is an independently operated and does not require any alteration prior to implementation in an electronic apparatus.

The first connector 100 includes a main body 110, and a plurality of first terminals 120 mounted within the main body 110 in such a manner that coupling sections 121 of the terminals 120 are exposed to exterior of the main body 110. The first connector 100 further includes a solder leg 130.

The adapter module 200 includes a main element 201 and an adapter element 202.

The main element 201 includes a main body 210 having a top end face 211 formed with a first reception chamber 212 for receiving the first connector 100 therein. The first reception chamber 212 has a bottom surface formed with a first engaging recess 2121 and a terminal recess 2122. Once the first connector 100 is inserted into the first reception chamber 212, the solder leg 130 is received in the first engaging recess 2121, thereby coupling the first connector 100 and the main element 201 together. The first reception chamber 212 and the first engaging recess 2121 are communicated spatially.

The main body 210 further has a bottom end face 214 formed with a second reception chamber 215, a third reception chamber 216 and a first positioning recess 217. The adapter element 202 is inserted into the second reception chamber 215, which, in turn, is communicated spatially with the terminal recess 2122 while the second connector 300 is inserted into the third reception chamber 216. The third reception chamber 216 has a bottom surface formed with a second positioning recess 2162 and a limit recess 2161 at a lateral side thereof.

In this embodiment, the main element 201 and the adapter element 202 can be integrally formed with each other. The adapter element 202 includes a main body 220 formed with first and second position blocks 230, 240 at a lateral side thereof. The adapter element 202 further includes a plurality of adapter terminals 260 installed in the main body 220.

After the adapter element 202 is inserted into the second reception chamber 215, the first and second position blocks 230, 240 are respectively received in the first positioning recess 217 and the second positioning recess 2162.

Note that the adapter terminals 260 extend through the main body 220. Each adapter terminal 260 has a connecting section 261 that is exposed from an upper portion, that is received in the terminal recess 2122, and that is electrically connected to a respective first terminal 120. Each adapter terminal 260 further has a soldering section 262 exposed from a lower portion of the main body 220 for soldering to a printed circuit board, thereby forming the electrical connector assembly 1000 of the present invention.

Figure 3:
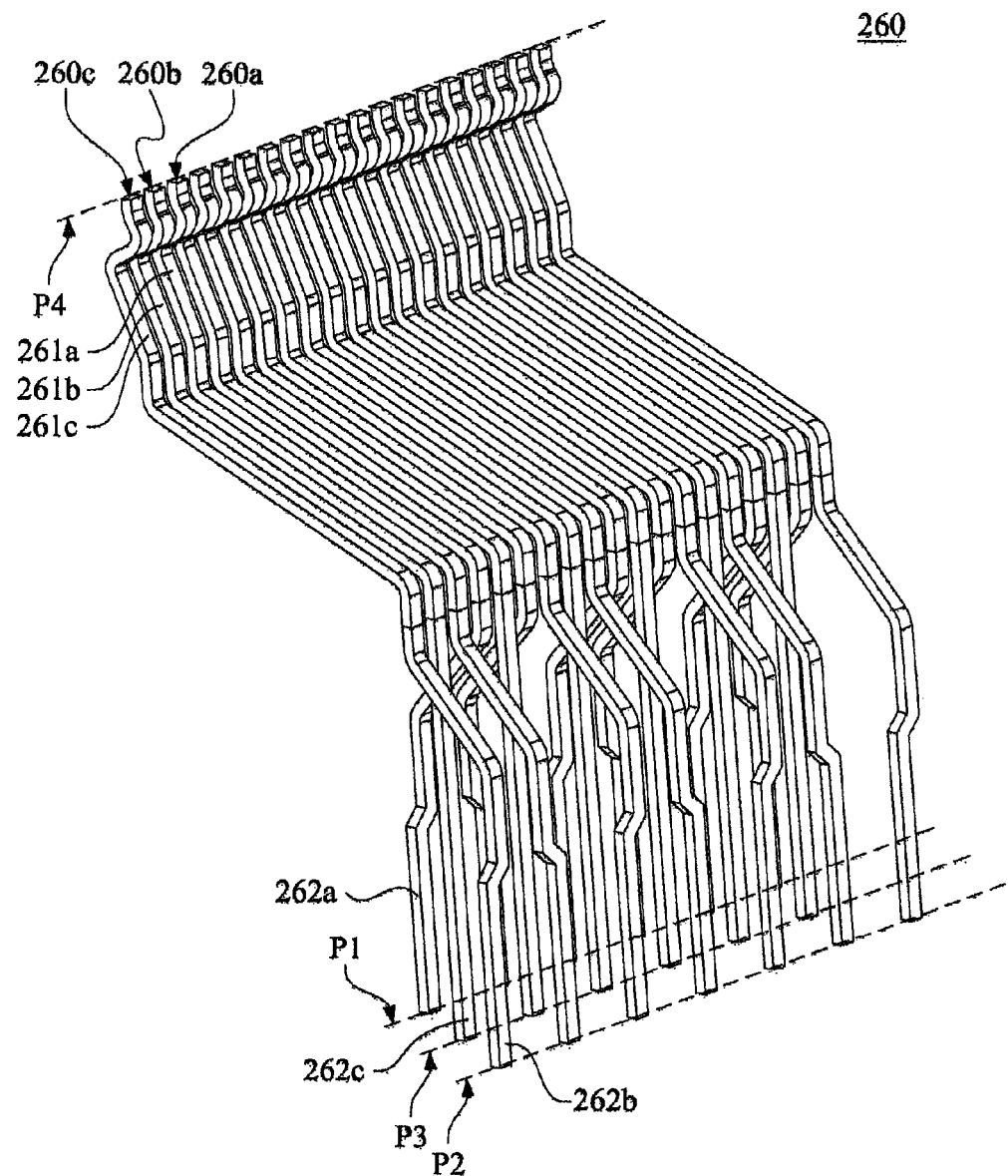
FIG. 3 is a perspective view of a plurality of adapter terminals of one type employed in the electrical connector assembly of the present invention.

FIG. 3 shows a perspective view of a plurality of adapter terminals 260 of one type employed in the adapter module 200 of the present invention. The adapter terminals 260 consists of a plurality of first adapter terminals 260a, a plurality of second adapter terminals 260b and a plurality of third adapter terminals 260c. Each first adapter terminal 260a has a coupling section 261a and a soldering section 262a. Each second adapter terminal 260b has a coupling section 261b and a soldering section 262b. Each third adapter terminal 260c has a coupling section 261c and a soldering section 262c. The third, second and first adapter terminals 260c, 260b, 260a are arranged staggered to one another in such a manner that the coupling sections 261a, 261b, 261c are respectively and electrically connected to the first terminals 120 while the soldering sections 262a of the first adapter terminal 260a extend along a first axis P1, the soldering sections 262b of the second adapter terminals 260b extend along a second axis P2, the soldering sections 262c of the third adapter terminals 260c extend along a third axis P3. Note that the axes P1, P2 and P3 are parallel to one another.

Since the soldering sections 262a, 262b, 262c are spaced apart in parallel manner by a predetermined gap, electromagnetic interference among the adapter terminals 260 is effectively prevented. Moreover, alignment of the first terminals 120 in a single direction is converted into three parallel directions via the adapter terminals 260 such that without altering the structure of the first connector 100, the adapter module 200 can be coupled to the printed circuit board having different layout of soldering contacts.

Figure 3A:
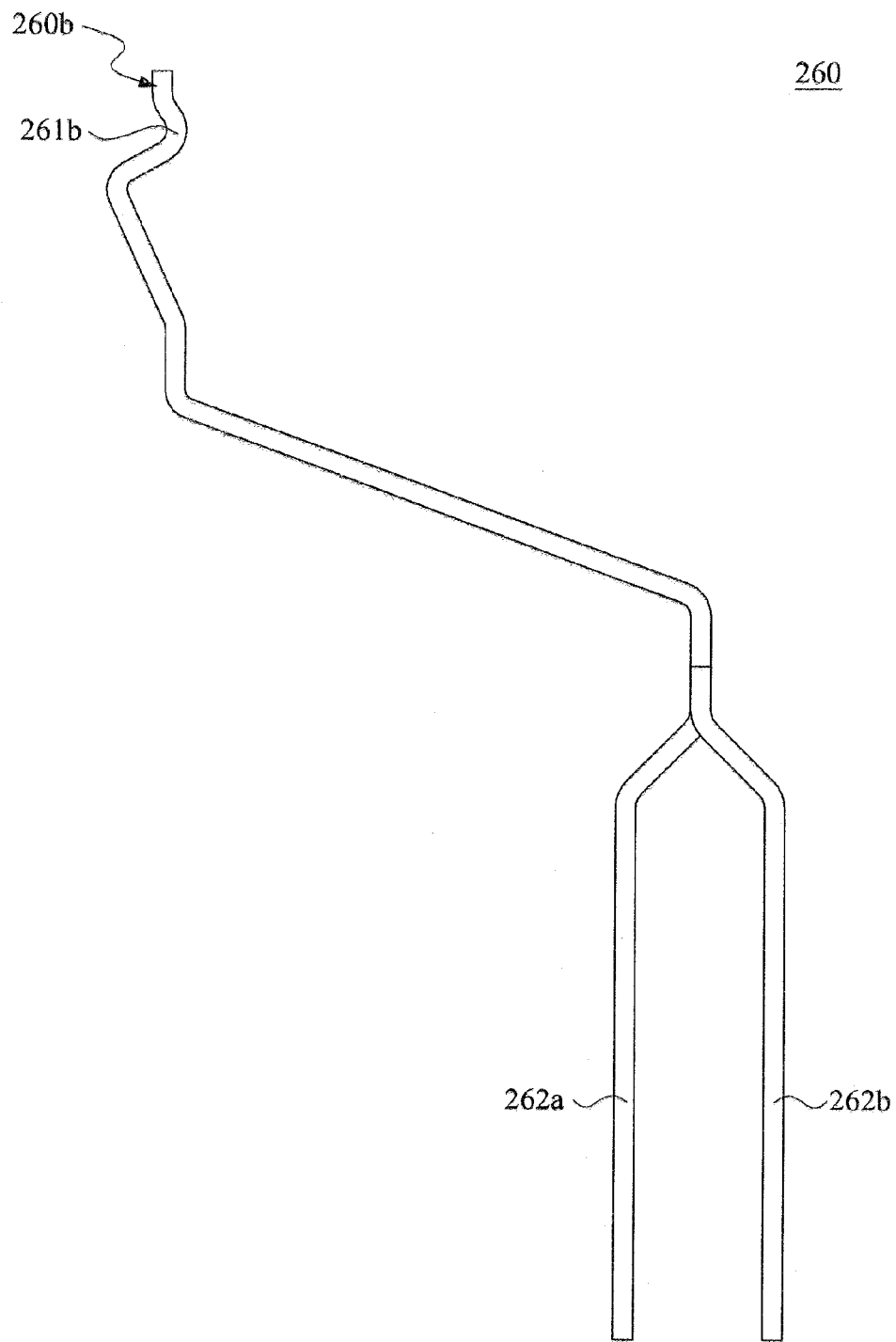
FIG. 3A is a perspective view of one adapter terminal of another type employed in the electrical connector assembly of the present invention.

FIG. 3A is a perspective view of one third adapter terminal 260 of another type employed in the adapter module 200. The only difference with the previous one resides in that the soldering section is bifurcated in order to conform to the soldering contacts in the printed circuit board.

The second connector 300 can be DVI, D-SUB, HDMI, USB, E-SATA, RJ45 types, the restriction should not be limited only to these types. The second connector 300 is an independently operated piece and does not require any alteration prior to implementation in an electronic apparatus. In this embodiment, the structure of the second connector 300 is slightly altered in order to fasten securely to the adapter module 200. In another embodiment, the structure of the adapter module 200 can be slightly altered without changing the structure of the second connector 300 in order to fasten securely to the adapter module 200.

The second connector 300 includes a main body 310 and a positioning block 320 projecting outward from the main body. When the second connector 300 is inserted into the third reception chamber 216, the positioning block 320 is received within the limit recess 2161, thereby fastening the second connector 300 on the adapter module 200. Since the positioning block 320 is currently added to the second connector 300 while the remaining members remain unchanged, a relatively large amount of expense can be economized for production of the electrical connector assembly of the present invention.

The metal casing 400 is provided for enclosing the first connector 100, the main element 201 and the adapter element 202 so as to prevent the assembly from being disturbed by electromagnetic interference.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An electrical connector assembly for coupling to a printed circuit board, comprising:
    a first connector having a plurality of first terminals;
    a main element for coupling to said first connector, and formed with a terminal recess for reception of said first terminals therein; and
    an adapter element for coupling to said main element, and including a plurality of adapter terminals coupled to the printed circuit board, each having a connecting section that is received in said terminal recess and that is electrically connected to a respective one of said first terminals.

2. The electrical connector assembly according to claim 1, wherein said main element and said adapter element are integrally formed with each other.

3. The electrical connector assembly according to claim 1, wherein said main element has a top end face formed with a first reception chamber for receiving said first connector therein.

4. The electrical connector assembly according to claim 3, wherein said first connector is formed with a solder leg while said first reception chamber has a bottom surface formed with a first engaging recess for receiving said solder leg of said first connector.

5. The electrical connector assembly according to claim 3, wherein said terminal recess is formed in said bottom surface of said first reception chamber.

6. The electrical connector assembly according to claim 3, wherein said terminal recess is communicated spatially with said first reception chamber.

7. The electrical connector assembly according to claim 1, wherein said main element has a bottom end face formed with a second reception chamber for receiving said adapter element therein.

8. The electrical connector assembly according to claim 7, wherein said terminal recess is communicated spatially with said first reception chamber.

9. The electrical connector assembly according to claim 7, wherein said adapter element has a first position block, said bottom end face of said main element further having a first positioning recess for receiving said first position block therein when said main and adapter elements are coupled together.

10. The electrical connector assembly according to claim 1, wherein said main element has a bottom end face formed with a third reception chamber.

11. The electrical connector assembly according to claim 10, further comprising a second connector inserted into said third reception chamber in said main element.

12. The electrical connector assembly according to claim 11, wherein said bottom end face of said main element is formed with a limit recess, said second connector having a positioning block inserted into said limit recess when said main and adapter elements are coupled together.

13. The electrical connector assembly according to claim 1, further comprising a second connector for coupling electrically to said adapter element.

14. The electrical connector assembly according to claim 1, wherein said plurality of adapter terminals includes
a plurality of first adapter terminals, each having a coupling section and a soldering section,
a plurality of second adapter terminals arranged staggered relative to said first adapter terminals, each second adapter terminal having a coupling section and a soldering section,
wherein, said coupling sections of said first and second adapter terminals are respectively and electrically connected to said first terminals while said soldering sections of said first adapter terminal extend along a first axis, said soldering sections of said second adapter terminals extend along a second axis parallel to said first axis.

15. The electrical connector assembly according to claim 14, wherein said coupling sections of said first and second adapter terminals extend parallel to each other.

16. The electrical connector assembly according to claim 1, wherein said plurality of adapter terminals includes
a plurality of first adapter terminals, each having a coupling section and a soldering section,
a plurality of second adapter terminals, each having a coupling section and a soldering section, and
a plurality of third adapter terminals arranged staggered to said first and second adapter terminals, each third adapter terminal having a coupling section and a soldering section,
wherein, said coupling sections of said first, second and third adapter terminals are respectively and electrically connected to said first terminals while the soldering sections of the first adapter terminal extend along a first axis, the soldering sections of the second adapter terminals extend along a second axis, the soldering sections of the third adapter terminals extend along a third axis parallel to said first and second axes.

17. The electrical connector assembly according to claim 16, wherein said coupling sections of said first, second and third adapter terminals extend parallel to one another.

18. The electrical connector assembly according to claim 1, further comprising a metal casing for enclosing said first connector, said main and adapter elements.

19. An adapter module for coupling electrically to a first connector having a plurality of first terminals and a second connector so as to define an electrical connector assembly, the adapter module comprising:
a main element for coupling to the first connector, and formed with a terminal recess for reception of the first terminals therein; and
an adapter element for coupling to said main element, and including a plurality of adapter terminals coupled to a printed circuit board, each having a connecting section that is received in said terminal recess and that is electrically connected to a respective one of the first terminals.

20. The adapter module according to claim 19, wherein said main element and said adapter element are integrally formed with each other.

21. The adapter module according to claim 19, wherein said main element has a top end face formed with a first reception chamber for receiving the first connector therein.

22. The adapter module according to claim 21, wherein the first connector is formed with a solder leg, said first reception chamber having a bottom surface formed with a first engaging recess for receiving said solder leg of the first connector.

23. The adapter module according to claim 21, wherein said terminal recess is formed in a bottom surface of said first reception chamber.

24. The adapter module according to claim 21, wherein said first reception chamber and said terminal recess are communicated spatially.

25. The adapter module according to claim 19, wherein said main element has a bottom end face formed with a second reception chamber for receiving said adapter element therein.

26. The adapter module according to claim 25, wherein said second reception chamber is communicated with said terminal recess spatially.

27. The adapter module according to claim 25, wherein said adapter element has a first position block, said bottom end face of said main element further having a first positioning recess for receiving said first position block therein when said main and adapter elements are coupled together.

28. The adapter module according to claim 19, wherein said main element has a bottom end face formed with a third reception chamber for receiving the second connector therein.

29. The adapter module according to claim 28, wherein the second connector includes a positioning block, said third reception chamber having a bottom surface formed with a limit recess for receiving said positioning block of said second connector when the second connector is inserted into said third reception chamber.

30. The adapter module according to claim 19, wherein said plurality of adapter terminals include
a plurality of first adapter terminals, each having a coupling section and a soldering section, and
a plurality of second adapter terminals staggered with said first adapter terminals respectively, each second adapter terminal having a coupling section and a soldering section, wherein, said coupling sections of said first and second adapter terminals are respectively and electrically connected to said first terminals while said soldering sections of said first adapter terminal extend along a first axis, said soldering sections of said second adapter terminals extend along a second axis parallel to said first axis.

31. The adapter module according to claim 30, wherein said coupling sections of said first and second adapter terminals extend parallel to each other.

32. The adapter module according to claim 19, wherein said plurality of adapter terminals includes
   a plurality of first adapter terminals, each having a coupling section and a soldering section,
   a plurality of second adapter terminals, each having a coupling section and a soldering section, and
   a plurality of third adapter terminals arranged staggered to said first and second adapter terminals, each third adapter terminal having a coupling section and a soldering section, wherein, said coupling sections of said first, second and third adapter terminals are respectively and electrically connected to said first terminals while the soldering sections of the first adapter terminal extend along a first axis, the soldering sections of the second adapter terminals extend along a second axis, the soldering sections of the third adapter terminals extend along a third axis parallel to said first and second axes.

33. The adapter module according to claim 32, wherein said coupling sections of said first, second and third adapter terminals extend parallel to one another.

34. The adapter module according to claim 19, further comprising a metal casing for enclosing said first connector, said main and adapter elements.

* * * * *